United States Patent
Yamaguchi et al.

(10) Patent No.: US 7,760,328 B2
(45) Date of Patent: Jul. 20, 2010

(54) EXPOSURE APPARATUS AND EXPOSING METHOD AND METHOD OF MANUFACTURING A PRINTED WIRING BOARD

(75) Inventors: Yoshihide Yamaguchi, Yokohama (JP); Hiroshi Oyama, Yokohama (JP)

(73) Assignee: Hitachi Via Mechanics, Ltd., Ebina-shi (JP)

( * ) Notice: Subject to any disclaimer, the term of this patent is extended or adjusted under 35 U.S.C. 154(b) by 604 days.

(21) Appl. No.: 11/370,044

(22) Filed: Mar. 8, 2006

(65) Prior Publication Data
US 2006/0215143 A1    Sep. 28, 2006

(30) Foreign Application Priority Data

| Mar. 22, 2005 | (JP) | ............................. 2005-080836 |
| Mar. 22, 2005 | (JP) | ............................. 2005-080841 |
| Feb. 2, 2006  | (JP) | ............................. 2006-025889 |

(51) Int. Cl.
G03B 27/72 (2006.01)

(52) U.S. Cl. ......................................... 355/69; 355/53

(58) Field of Classification Search .................. 355/69, 355/20, 53; 349/40, 42, 48
See application file for complete search history.

(56) References Cited

U.S. PATENT DOCUMENTS

| 5,229,872 | A  | * | 7/1993  | Mumola ........................ 349/2 |
| 6,355,398 | B1 |   | 3/2002  | Fromson et al. |
| 2001/0038484 | A1 |   | 11/2001 | Harada |
| 2002/0126479 | A1 |   | 9/2002  | Zhai et al. |
| 2003/0117598 | A1 |   | 6/2003  | Case et al. |
| 2003/0147060 | A1 | * | 8/2003  | Tokuda et al. .................. 355/53 |
| 2003/0188652 | A1 | * | 10/2003 | Mclean et al. ........... 101/450.1 |
| 2004/0008332 | A1 | * | 1/2004  | Nakaya et al. ................. 355/53 |
| 2005/0152146 | A1 | * | 7/2005  | Owen et al. .................. 362/294 |
| 2006/0215139 | A1 |   | 9/2006  | Oshida et al. |

FOREIGN PATENT DOCUMENTS

| EP | 0 909 989    | 4/1991  |
| EP | 0 639 799    | 2/1995  |
| EP | 1 602 979    | 12/2005 |
| JP | 62-021220    | 1/1987  |
| JP | 2002-296402  | 10/2002 |
| JP | 2004-039871  | 2/2004  |
| JP | 2004-071624  | 3/2004  |
| JP | 2004-085728  | 3/2004  |
| JP | 2004-157219  | 6/2004  |

* cited by examiner

*Primary Examiner*—Edward J Glick
*Assistant Examiner*—Mesfin T Asfaw
(74) *Attorney, Agent, or Firm*—Antonelli, Terry, Stout & Kraus, LLP.

(57) ABSTRACT

The mask-less exposure apparatus includes: a stage which moves with the substrate having a photosensitive resin layer with sensitivity to ultraviolet radiation formed thereon; a first light source for emitting light containing a wavelength component in the wavelength range of 300 to 410 nm; a first light irradiation optical system for modulating a radiant flux emitted from the first light source based on data of a desired exposure pattern to image a pattern on the photosensitive resin layer; a second light source for emitting light containing a wavelength component in the wavelength range of 450 to 2500 nm; and a second light irradiation optical system for guiding a radiant flux emitted from the second light source to a second light irradiation area that is set so as to include at least a first light irradiation area.

5 Claims, 8 Drawing Sheets

RECEIVED LIGHT INTENSITY WAVEFORM

RECEIVED LIGHT INTENSITY WAVEFORM

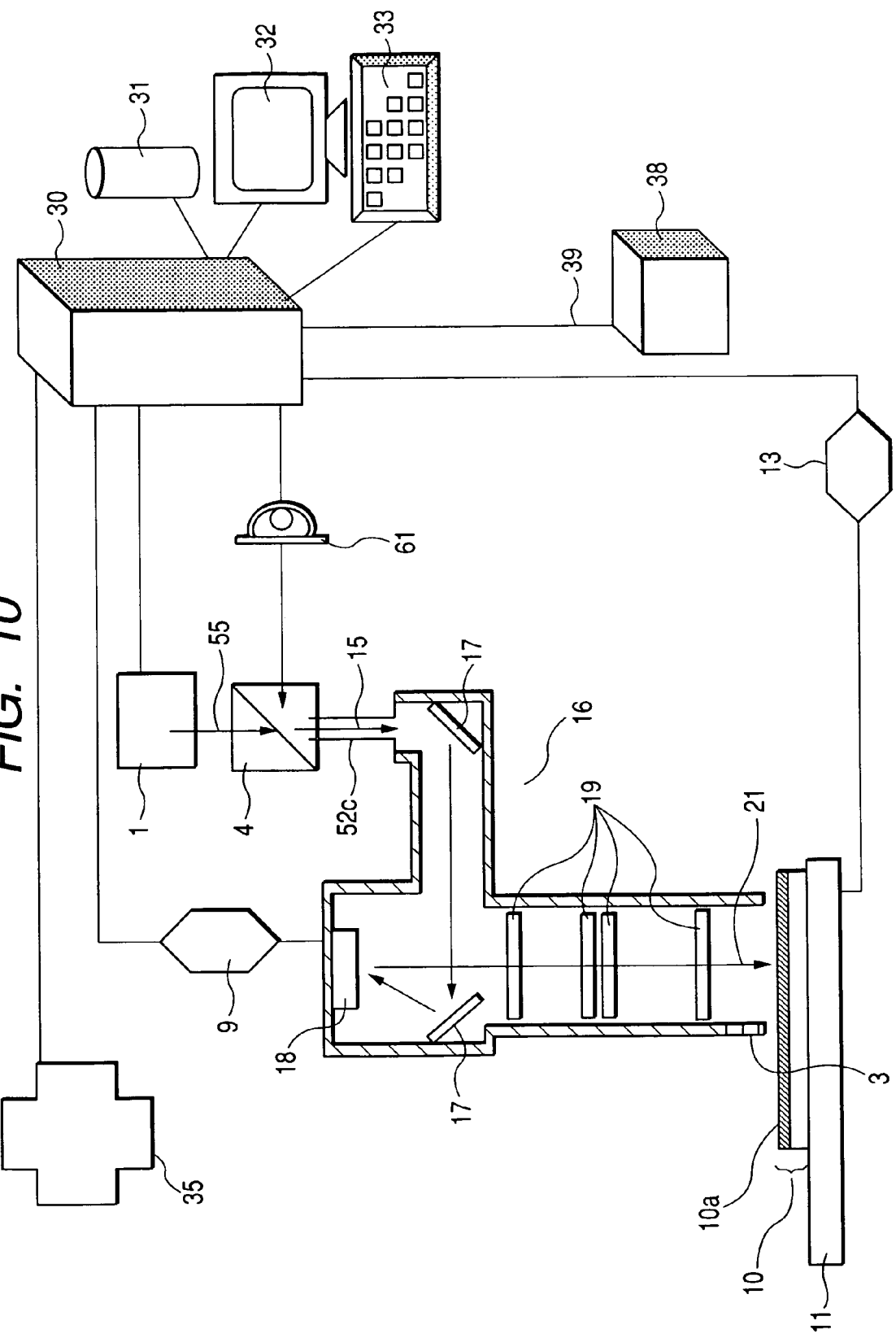

the exposure process to increase the throughput cannot be easily combined with the mask-less direct exposing technique using beam scanning exposure. It is described in the

EXPOSURE APPARATUS AND EXPOSING METHOD AND METHOD OF MANUFACTURING A PRINTED WIRING BOARD

BACKGROUND OF THE INVENTION

The present invention relates to an exposure apparatus and an exposing method for directly writing (drawing) and exposing a pattern on a photosensitive resin without using any of masks (in a mask-less manner), and a printed wiring board manufacturing method of manufacturing a printed wiring board by utilizing the exposing method.

In recent years, a requirement for low cost and/or high throughput production has been increased as multi-item and small-lot production of printed wiring boards has advanced.

In processing a pattern for a printed wiring board or the like in the prior art, various kinds of photosensitive resins called photo resists are used in various processes. More specifically, after a photosensitive liquid resist or dry film resist is coated on a board, the photosensitive liquid resist or dry film resist thus coated is exposed through a photo mask, and etching process, plating process and the like are performed after a developing process, thereby forming a predetermined pattern.

Instead of the pattern forming technique as described above, a mask-less direct exposing technique using a gas laser, such as an argon ion laser, for emitting visible light as a light source has been introduced since 1990s. This technique has such a feature that the cost of mask manufacture equipment and the material cost can be greatly saved and highly precise exposure can be made because the manufacture of the photo masks is unnecessary. Thus, this technique is expected as a technique for innovating manufacturing processes for a printed wiring board, a semiconductor package or the like.

In order to improve the maintenance performance for the gas laser in the mask-less direct exposing technique, it has been proposed to use a semiconductor laser diode not requiring supply of any of process gases as a light source. For example, JP-A 2004-85728 describes a method of directly exposing a photosensitive resin having specific composition containing an infrared absorbing coloring matter to a laser beam having a wavelength in the range of 750 to 1200 nm.

On the other hand, instead of the method of scanning a photosensitive resist with a laser beam reflected by a polygon mirror scanner, a direct exposing method using a digital micro mirror device (DMD) as an optical system having high generality is attracting the attention of the industry as an idea for improving the light applying method. The DMD is a spatial modulator including a reflecting mirror array which is integrated on a semiconductor chip by utilizing a micro machine technique. The reflecting mirrors operate at a high speed in accordance with digital information. The DMD is used as a DMD engine in combination with an optical system such as a micro lens array, a diffracting grating or the like. For example, JP-A 62-21220, JP-A 2004-157219, JP-A 2004-39871, etc. describe the mask-less exposing method using the DMD.

On the other hand, a technique for heating a substrate to increase sensitivity of a photo resist after exposure but before development is generally known in the art. For example, JP-A 2004-71624 describes an exposure apparatus including an exposing unit for irradiating a substrate having a photosensitive material applied thereon through a photo mask with light to expose the photosensitive material, and a baking unit for subjecting the substrate to heating processing after exposure but before development. Also, JP-A 2002-296402 provides a description in which an infrared ray lamp may be used for heating processing.

SUMMARY OF THE INVENTION

As a result of examination of the above-mentioned prior art, in the light of the recent requirement level of low cost production, fast production, and stabilization of the manufacture process (high quality production), it has been found out that improvements are still required. Also, in the light of the material cost, availability, and photosensitive property of the photosensitive resin which has been generally used, it has been found out that there is still room for improvement in selecting wavelength or intensity of modulated light used in the pattern writing or exposure in the above-mentioned prior art.

A photosensitive wavelength range of a photosensitive resin which is generally used in mass production factories of the printed wiring boards is designed in consideration of the mass production workability. Also, the photosensitive resin components are mixed into the composition in which the sensitivity is low in a wavelength range of visible light (400 to 800 nm). For reference, FIG. 4 shows an example of typical photosensitive sensitivity of a photosensitive resin that is generally used. In addition, since both photon energy and quantum yield for electron transition of an infrared radiation are low, the photosensitive reaction does not efficiently occur. Hence, as a matter of course, the photosensitive reaction induced by an infrared radiation is slower by an ultraviolet radiation. Consequently, in the case of the technique, disclosed in JP-A 2004-85728, using an infrared laser, a light application period of time required for a photosensitive material to reach desired curing degree becomes long. In addition, it is inevitable to use a special photosensitive material containing an infrared absorbing coloring matter and use a high-output expensive laser source. As a result, it is impossible to sufficiently meet the purposes of realizing a high-quality exposure.

On the other hand, the DMD devices used in JP-A 62-21220, JP-A 2004-157219, and JP-A 2004-39871 do not have sufficient ultraviolet radiation durability. Thus, the DMD device is forced to be used only in a visible light wavelength range (400 nm or more) in which the sensitivity of the photo resist is relatively low. Thus, in this case as well, a light application period of time required for the photosensitive material to reach desired curing degree becomes long. In addition, a high-luminance light source must be used. Hence, the techniques disclosed in JP-A 62-21220, JP-A 2004-157219, and JP-A 2004-39871 do not meet the purpose of realizing short-time exposure and low cost. As a result, it is being difficult to respond the requirement for fast production which has been increased more and more recently.

JP-A 2004-157219 describes a technique for increasing the intensity of the light source in order to increase the exposure throughput. However, even when the intensity of the light source is doubled, the reaction speed is not doubled due to the phenomenon called reciprocity law failure to the exposure and photosensitive reaction. Hence, it is not always easy to obtain an increase in throughput corresponding to an increase in light source cost.

On the other hand, the technique, disclosed in JP-A 2004-71624 and JP-A 2002-296402, for increasing the sensitivity of the photo resist by heating the substrate after completion of the exposure process to increase the throughput cannot be easily combined with the mask-less direct exposing technique using beam scanning exposure. It is described in the paragraph of "Problem to be Solved by the Invention" of JP-A 2004-71624 that control for a period of time from exposure to heating is effective in process stabilization. Thus, this description suggests that the instability of the process is an actual problem in terms of the practical mass production in this technique.

In the exposure technique for beam scanning, it takes some period of time from the beginning of the beam scanning exposure at one end portion of the substrate to the completion of the beam scanning exposure at the other end portion of the substrate. As a result, when the following process is started immediately after the substrate is taken out from the exposure apparatus after completion of the exposure process, it is difficult that the period of time from the exposure treatment to the following treatment is maintained constant within the whole surface of the substrate. Hence, when a process for heating the substrate is inserted after completion of the exposure process, it becomes difficult to control the period of time from the exposure process to the heating process. As a result, instability of the exposure process is caused, and thus a risk increases in which the yield becomes worse. If a process is adopted for heating the substrate after the substrate is stationarily held as it is for some time after completion of the exposure process, the instability of the process is avoided. However, this poses a problem in that the exposure throughput is decreased.

As has been described so far, the technique which has been known until now in order to increase the exposure throughput in the scanning exposing method of performing the beam scanning and exposure without using any masks is concerned with any one of (1) adopting highly sensitive photo resist, (2) increasing beam intensity, and (3) heating after completion of the exposure process. However, as described above, (1) when the highly sensitive photo resist is adopted, the problem arises in that the mass production workability is reduced. (2) When the beam intensity is increased, the case becomes worse rather than the previous case in terms of the cost effectiveness. Also, (3) when the heating is performed after completion of the exposure process, the problem arises such that the yield of the exposing process becomes worse.

The present invention has been made in order to solve the above-mentioned problems, and it is therefore an object of the present invention to provide an exposure apparatus and an exposing method capable of realizing all requirements for low-cost, high-throughput, and stabilization of manufacturing process in the so-called mask-less exposure technique in which a beam modulated into a desired pattern is scanned to perform exposure, and a method of manufacturing a printed wiring board by using the exposing method.

The inventors of the present invention have found out the following phenomenon in a course of examining the photo-curing reaction of the photosensitive resin. That is to say, when a radiation in the range from visible to infrared (hereinafter referred to as "visible to infrared radiation") and an ultraviolet or near-ultraviolet radiation (wavelength of 300 to 410 nm) (hereinafter referred to as "ultraviolet to near-ultraviolet radiation") fall simultaneously on the photosensitive resin, the larger hardness is likely to be obtained as compared with the case of a single irradiation of ultraviolet to near-ultraviolet radiation. Also, a desired film thickness is likely to be obtained with less exposure dose. In other words, this phenomenon means that the simultaneous irradiation of the visible to infrared radiation and the ultraviolet to near-ultraviolet radiation to the photosensitive resin makes it possible to efficiently promote the photo reaction. This phenomenon is applied to the mask-less exposing technique through the following aspects, thus leading to the present invention.

According to an aspect of the present invention, there is provided an exposure apparatus for directly exposing an exposure pattern on a substrate (a board) to be exposed without using any of photo masks, the exposure apparatus including: a stage which moves with the substrate to be exposed placed thereon, the substrate having a photosensitive resin layer with sensitivity to ultraviolet radiation formed thereon; a first light source for emitting light containing a wavelength component in the wavelength range of 300 to 410 nm; a first light irradiation optical system for modulating a radiant flux emitted from the first light source based on data of a desired exposure pattern to image a pattern on the photosensitive resin layer located on the stage; a second light source for emitting light containing a wavelength component in the wavelength range of 450 to 2500 nm; and a second light irradiation optical system for guiding a radiant flux emitted from the second light source to a second light irradiation area that is set so as to include at least a first light irradiation area that is exposed and written by using the first light irradiation optical system.

While in the present invention, the various kinds of light sources can be used as the first light source, a light source constituted by a semiconductor laser, e.g., a laser array having a plurality of semiconductor lasers arranged to each other is given as an example. Lamp-like light sources, e.g., a mercury lamp, a metal halide lamp, a xenon lamp, a black-light fluorescent lamp and the like may be given as other light sources. When any suitable one of these light sources is used, the wavelength and intensity of the emitted light are desirably limited by a filter or the like.

According to another aspect of the present invention, there is provided an exposure apparatus for directly exposing an exposure pattern on a substrate (a board) to be exposed without using any of photo masks, the exposure apparatus including: a stage which moves with the substrate to be exposed placed thereon, the substrate having a photosensitive resin layer with sensitivity to ultraviolet radiation formed thereon; a first light source for emitting light containing a wavelength component in the wavelength range of 300 to 410 nm; a first light irradiation optical system for modulating a radiant flux emitted from the first light source based on data of a desired exposure pattern to image a pattern on the photosensitive resin layer located on the stage; a second light source for emitting light containing a wavelength component in the wavelength range of 2500 to 25,000 nm; and a second light irradiation optical system for guiding a radiant flux emitted from the second light source to a second light irradiation area that is set so as to include at least a first light irradiation area that is exposed and drawn by using the first light irradiation optical system.

Preferably, the first light source according to another aspect of the present invention is constituted by a laser diode array having a plurality of semiconductor laser diodes arranged to each other.

Preferably, in the exposure apparatus according to the present invention, the first light irradiation optical system includes: a two-dimensional light modulation optical system for modulating the radiant flux emitted from the first light source every pixel based on the data of the exposure pattern to form an exposed pattern; and an imaging optical system for imaging pattern light formed by the two-dimensional light modulation optical system on the photosensitive resin.

Preferably, in the exposure apparatus according to the present invention, the first light irradiation optical system includes: a beam scanning optical system for scanning the radiant flux emitted from the first light source; and an imaging optical system for imaging pattern light formed by the beam scanning optical system on the photosensitive resin located on the stage.

Preferably, the exposure apparatus according to the present invention further includes a radiant flux controlling mechanism for substantially simultaneously irradiating a radiant flux emitted from the first light source and a radiant flux emitted from the second light source to the photosensitive resin layer located on the stage.

Preferably, the radiant flux controlling mechanism includes at least either a power controlling mechanism for controlling power to be supplied to the light source or a light shielding mechanism provided in a middle of an optical path of the light irradiation optical system.

According to still another aspect of the present invention, there is provided an exposure apparatus for directly exposing an exposure pattern on a substrate (a board) to be exposed without using any of photo masks, the exposure apparatus including: a stage which moves with the substrate to be exposed placed thereon, the substrate having a photosensitive resin layer with sensitivity to ultraviolet radiation formed thereon; a first light source for emitting light containing a wavelength component in the wavelength range of 300 to 410 nm; a second light source for emitting light containing a wavelength component in the wavelength range of 450 to 25,000 nm; an optical mixing optical system for optically mixing at least part of a radiant flux emitted from the first light source and at least part of a radiant flux emitted from the second source; and a light irradiation optical system for modulating light obtained through the optical mixing by the optical mixing optical system based on data of a desired exposure pattern to image a pattern on the photosensitive resin layer located on the stage.

According to yet another aspect of the present invention, there is provided an exposure apparatus for directly exposing an exposure pattern on a substrate (a board) to be exposed without using any of photo masks, the exposure apparatus including: a stage which moves with the substrate to be exposed placed thereon, the substrate having a photosensitive resin layer with sensitivity to ultraviolet radiation formed thereon; a first light source for emitting light containing a wavelength component in the wavelength range of 300 to 410 nm; a first light modulation optical system for modulating a radiant flux emitted from the first light source based on data on a desired exposure pattern; a second light source for emitting light containing a wavelength component in the wavelength range of 450 to 25,000 nm; a second light modulation optical system for modulating a radiant flux emitted from the second light source based on data on a desired exposure pattern; and a light irradiation optical system for optically mixing said radiant flux emitted from the first light modulation optical system and said radiant flux emitted from the second light modulation optical system to image a pattern on the photosensitive resin layer located on the stage.

According to a further aspect of the present invention, there is provided a exposing method for directly exposing an exposure pattern to a photosensitive resin layer formed on a substrate to be exposed, including: a first light irradiation process for modulating a radiant flux emitted from a first light source for emitting light containing a wavelength component in the wavelength range of 300 to 400 nm based on data of a desired exposure pattern and irradiating the resulting modulated radiant flux to the substrate to be exposed on which a photosensitive resin layer having sensitivity to ultraviolet radiation is formed; and a second light irradiation process for irradiating a radiant flux emitted from a second light source for emitting light containing a wavelength component in the wavelength range of 450 to 25,000 nm to the substrate to be exposed on which the photosensitive resin layer is formed.

Preferably, in the present invention, an area on the substrate to be exposed that is subjected to the light irradiation in the second light irradiation process contains at least an area that is subjected to the light irradiation in the first light irradiation process, and the second light irradiation process and the first light irradiation process are performed substantially simultaneously with each other.

Preferably, in the present invention, the photosensitive resin layer may be made of any one of a plating resist, an etching resist, and a solder resist. In this case, a method of manufacturing a printed wiring board can also be provided by utilizing the exposing method which the present invention provides.

As described above, according to the present invention, it is possible to provide the mask-less direct exposure apparatus which is capable of realizing all requirements for low cost, high throughput, and stabilization of the manufacturing processes, the exposing method for use in the exposure apparatus, and the method of manufacturing a printed wiring board by utilizing the exposing method.

BRIEF DESCRIPTION OF THE DRAWINGS

FIG. 10 is a schematic constructional diagram showing a third embodiment of the exposure apparatus according to the present invention.

DETAILED DESCRIPTION OF THE PREFERRED EMBODIMENTS

Preferred embodiments of a mask-less exposure apparatus, an exposing method and a printed wiring board manufacturing method according to the present invention will hereinafter be described in detail with reference to the accompanying drawings.

Figure 1:
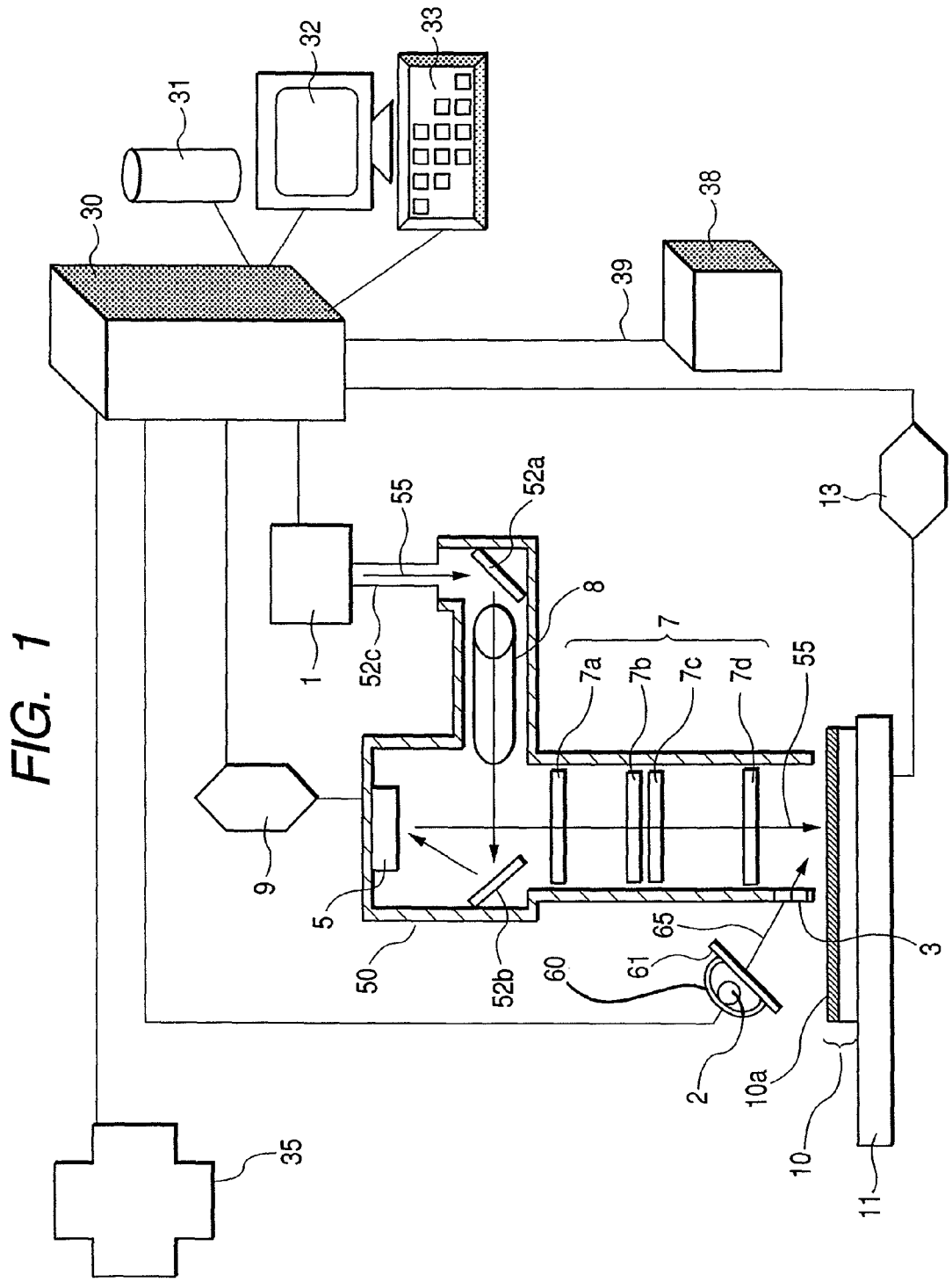
FIG. 1 is a schematic constructional diagram showing a first embodiment of an exposure apparatus according to the present invention.

FIG. 1 is a schematic constructional diagram showing a first embodiment of a mask-less exposure apparatus according to the present invention. The mask-less exposure apparatus includes a stage 11, a first light source 1, a first light irradiation optical system 50, a second light source 2, and a second light irradiation optical system 60. The stage 11 moves with a board 10 to be exposed placed thereon. The board 10 has a photosensitive resin layer 10a with sensitivity to ultraviolet radiation formed thereon. The first light source 1 emits light containing a wavelength component, of violet radiation, in the wavelength range of 400 to 410 nm. The first light irradiation optical system 50 modulates a radiant flux 55 emitted from the first light source 1 based on data on a desired exposure pattern, and then images a pattern on the photosensitive resin layer 10a of the board 10 to be exposed which is placed on the stage 11 to expose and write the pattern. The second light source 2 emits light containing at least part of a wavelength component, from visible to near-infrared radiation, in the wavelength range of 450 to 2500 nm. The second light irradiation optical system 60 directs a radiant flux 65 emitted from the second light source 2 to a second light irradiation area which is set so as to contain a first light irradiation area obtained through exposure and writing by the first light irradiation optical system 50.

The photosensitive resin layer 10a suitable for the present invention is made of a photosensitive resin which is generally used for manufacture of a printed wiring board. Thus, the photosensitive resin layer 10a may have composition having a wavelength of 365 nm (i line) as a photosensitive dominant wavelength, or may have composition having a wavelength of 405 nm (h line) as a photosensitive dominant wavelength. In addition, the photosensitive resin layer 10a may be made of a photosensitive resin of a negative type or of a positive type. In the first embodiment, in consideration of a viewpoint of the material cost and the mass production results up to this day, the most suitable photosensitive resin 10a is made of a general negative type photosensitive material which is adjusted in composition having the wavelength of 365 nm (i line) as the photosensitive dominant wavelength. After being suitably formed on a surface of an object to be exposed (e.g., a printed wiring board) by utilizing a predetermined method, the photosensitive resin 10a is exposed. Even if the photosensitive resin layer 10a is of a dry film or liquid, it can be used in this embodiment without especially encountering any of problems. However, a film thickness of the photosensitive resin layer 10a, after formation, suitable for the present invention roughly falls within the range of about 2 to about 100 micrometers. A film thickness of the photosensitive resin 10a especially suitable for the present invention falls within the range of 10 to 80 micrometers. Also, a minimum processing size (line width) is about 2 micrometers. A composition of the photosensitive resin layer 10a suitable for the present invention is a modified acrylate system monomer or a modified methacrylate system monomer. A novolak acrylate system monomer, an epoxy acrylate system monomer, and an epoxy methacrylate system monomer are especially preferable. Taking a viewpoint of the material cost, the throughput, the process stability and the like as well into consideration, the photosensitive material containing about 10% or more epoxy acrylate system monomer is most suitable for the present invention. It needs no repetitive indication that any of the photosensitive materials having compositions other than those exemplified herein can also be used depending on the structures and applications of objects to be exposed. For example, the photosensitive resin containing photosensitive polyimide, photosensitive benzocyclobutane (BCB), photosensitive polybenzoxazole, photosensitive cardo acrylate (cardo resin) or the like as a main constituent may be used. In such a case, the application is made after the suitable processing conditions corresponding to the applications and objects of the respective materials are obtained. At that, the various kinds of application use are known for the photosensitive resins used in the wiring manufacturing process. Specific application use includes an etching resist, a plating resist, a solder resist, and a wiring cover ray. However, the conditions of the film formation process, the exposure process and the development process are slightly different from one another depending on the respective applications and objects. Incidentally, the experiments made by the inventors of the present invention show such a tendency that when in the first embodiment, the main constituent of the monomer is a non-modified acrylate system or methacrylate system photosensitive resin, this monomer indicates a curing reaction activating effect which is relatively worse than that indicated by the modified monomer. In addition, in the present invention, a negative type permanent resist which is used in the application such as a dam of solder (solder resist) has a tendency to be easy to obtain the more suitable results than those obtained in the non-permanent resist or the positive type resist which is used as the etching resist or the plating resist in the wiring forming process. In addition, in the present invention, the positive type resist is preferable from a viewpoint of definition, while the negative type resist is preferable from a viewpoint of a process margin in many cases. Also, when the positive type resist is applied in the case where the formation of the high definition image (minimum processing size=about 1 micrometer) is required, while the negative type resist is applied in the general application (processing size=10 to 1000 micrometers), the practical maximum effect is obtained in many cases.

Meanwhile, it is probable that the behavior of reactive activated species at the beginning of the photochemical reaction affects the optical reaction activating phenomenon which is caused when ultraviolet to near-ultraviolet radiation and visible to infrared radiation are simultaneously directed to the photosensitive resin. In a process of the exposure, the photosensitive molecules absorb ultraviolet to near-ultraviolet radiation inside the photosensitive resin to generate the reactive activated species (radicals or the like). In this case, it is probable that the reactivity of the reactive activated species right after the generation is increased by the irradiation of the visible to infrared radiation. Since a large number of elementary reaction processes competitively and simultaneously progress inside the photosensitive resin, the reaction mechanism is not easy to analyze. Thus, the reaction mechanism cannot be clearly explained. However, it is probable that an operation mechanism of the visible to infrared radiation is concerned with at least one of (1) a mechanism resulting from a photo elementary reaction (light reaction) and (2) a mechanism resulting from a non-photo elementary reaction (dark reaction).

The mechanism resulting from the photo elementary reaction is a mechanism in which the reactive activated species generated by absorption of an ultraviolet to near-ultraviolet radiation from the photosensitive molecule further absorb a visible to infrared radiation to be reactivated. Thus, there is a possibility that the photosensitive resin absorbs the visible to infrared radiation, whereby the reactive activated species reach high vibration/rotation levels within the range of the lowest electron excitation state. Alternatively, there is also a possibility that the reactive activated species absorb the visible to infrared radiation, whereby some energy transfer or electron transfer is induced, so that the reactive activated species are excited to a higher electron excitation state.

In general, the speed of the chemical reaction is expressed in the form of a function of a concentration, a temperature, and time. Hence, there is a way of thinking in which the temperature is recommended to be increased in order to increase the reaction speed of the photo elementary reaction process without changing the concentration of the reactive activated species (radicals or the like) generated in the photo elementary reaction process. Since the radicals have the maximum activities right after their generation, if the ambient temperature of the reactive activated species can be made to rise right after the reactive activated species are excited by ultraviolet to near-ultraviolet radiation, the photochemical reaction can be efficiently accelerated. As a result, it is possible to increase a pseudo-photosensitivity in the exposure process. In addition, since the photosensitive resin is generally in a solid state or in a gel state, the molecule motion is limited. However, the diffusion of the molecule becomes easy by reducing the viscosity of the matrix polymer with irradiation of the infrared radiation to accelerate the polymerization extension process.

The mechanism resulting from the non-photo elementary reaction process is a mechanism in which some reaction activating effect appears in the reaction extension process having the reactive activated species (radicals or the like) generated by the absorption of the ultraviolet to near-ultraviolet radiation by the photosensitive molecule as a starting point. While the reaction activating mechanism is not clarified at the present point, it may result from an increase in diffusion of the activated species, or may result from an increase in reaction of the non-photosensitive component (matrix polymer, binder or the like) in the photosensitive resin.

The first light source 1 in the present invention may use a conventional light source for emitting light containing a wavelength component, from ultraviolet to near-ultraviolet radiation, in the wavelength range of 300 to 410 nm. More specifically, the first light source 1 may be configured to arrange a large number of solid-state excitation laser light sources. Alternatively, a mercury lamp, a metal halide lamp, a xenon lamp, a black-light fluorescent lamp or the like may also be used. However, the most preferable form is a laser diode array having a plurality of blue ultraviolet (violet) laser diodes (emission wavelength=405±5 nm) arranged to each other. The reason for this is that it is unnecessary to specially provide an optical filter since the laser light source has high intensity, is easy in beam shaping, and has a narrow wavelength distribution. In addition, the laser diode light source is excellent in long life, less power consumption and miniaturization, and thus can be said to be the most practical light source. The first light source 1 exemplified in FIG. 1 is the laser diode array. It should be noted that when any of light sources other than the laser diode array is used, it desirably includes an optical mechanism (not shown) for taking out only the light having a specific wavelength range, or cutting off the light having a specific wavelength range. This is to exclude such disadvantage that the undesirable sub-reaction/side effect resulting from the irradiation of the light having a specific wavelength range.

As described above, the first light source 1 used in the first embodiment is the blue ultraviolet (violet) laser diode (emission wavelength=405±5 nm). On the other hand, the photosensitive dominant wavelength of the photosensitive resin 10a used in the first embodiment, as described above, is 365 nm. Consequently, the photosensitive reaction of the photosensitive resin 10a does not sufficiently proceeds only with the light emitted from the first light source 1 in some cases. In the present invention, as the means for solving this problem, emitted light 65 from the specially provided second light source 2 is directed to the photosensitive resin layer 10a. In the present invention, the light sources of two systems are provided in such a manner, and the object 10 to be exposed is exposed with a combination of selective exposure irradiation only for a pattern shape from the first light application light source 1 and surface irradiation for a non-pattern shape from the second light application light source 2. Thus, the synergetic effect of both the light energies occurs. As a result, the reciprocity law failure in the selective pattern exposure irradiation from the first light irradiation light source 1 is suppressed, and the shortening of the exposure time and the increase in exposure throughput are achieved which have not been realized by using the prior art.

Figure 5:
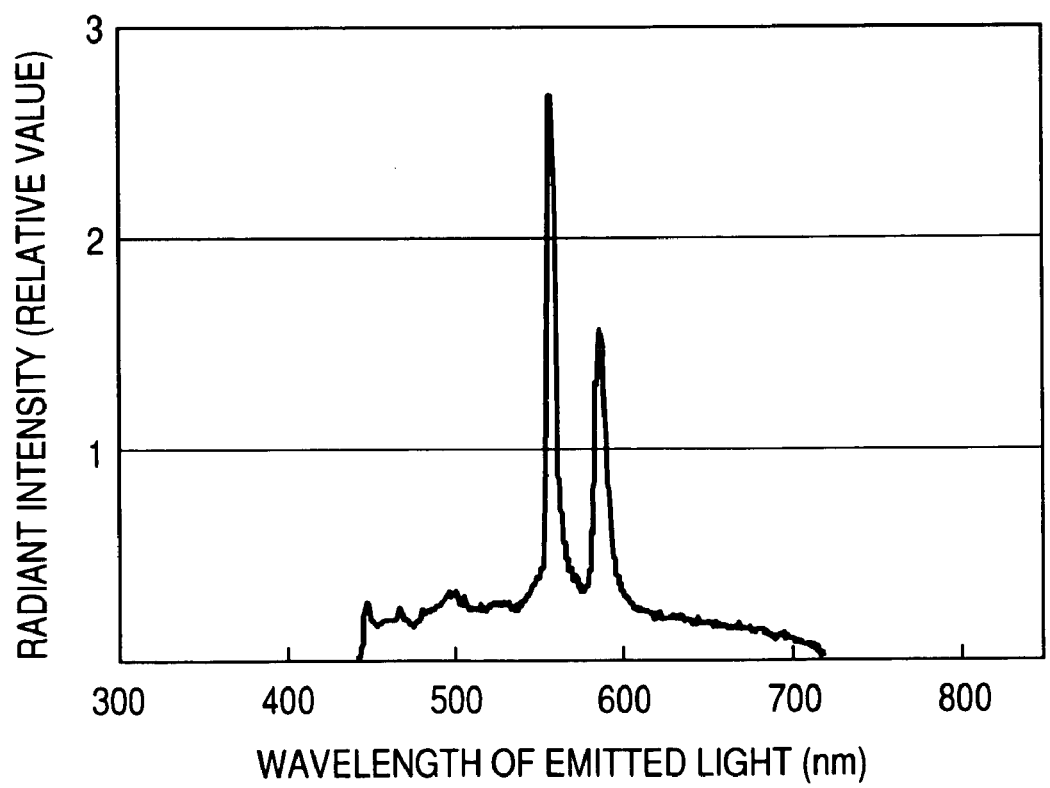
FIG. 5 is a graphical representation showing spectral emission characteristics of a second light source used in the exposure apparatus according to the present invention.

The second light source 2 used in the first embodiment is a conventional light source for emitting light containing a wavelength component, from visible to near-infrared radiation, in the wavelength range of 450 to 2500 nm. More specifically, a large number of semiconductor laser light sources for emitting visible to infrared radiation may be arranged. Alternatively, a halogen lamp, a xenon lamp, a metal halide lamp or the like may also be arranged. For example, when the halogen lamp is used instead of the infrared laser light source, lower cost for the light source becomes possible in some cases. In addition, a xenon lamp or a metal halide lamp can be used as the visible light source. When any of these lamp light sources is used, the unnecessary ultraviolet radiation component is removed by an optical filter 61. If the filter is attached to the second light source 2 to remove the ultraviolet component, when the photosensitive resin layer 10a containing the ultraviolet radiation photosensitive constituent merely receives the light emitted from the second light source 2, no electron excitation is induced. As a result, no optical reaction proceeds at all. In this embodiment, the metal halide lamp to which a wavelength filter for removing a wavelength component having a wavelength of 450 nm or less is mounted is used. FIG. 5 shows a spectral radiation distribution of the metal halide lamp with the wavelength filter which is used as the second light source 2 in this embodiment.

Incidentally, desirable results are obtained in the case where when any of light sources other than the metal halide lamp is used, a light source having a spectral radiant intensity in at least one wavelength area region of 500 to 850 nm, 1300 to 1700 nm, and 1900 to 2500 nm is used. The reason why the light source for emitting light containing the wavelength components enumerated herein gives the desirable results is not clear at the present point. However, there is a possibility that some constituent contained in the photosensitive resin layer 10a used in this embodiment has an absorption band in these near-infrared region. Alternatively, there is a relationship of $E_{365} \approx E_{405} + E_{2000}$ between the photon energy ($E_{365}$) required for the photosensitive reaction of the photosensitive resin layer 10a, the photon energy ($E_{405}$) of the emitted light from the first light source 1, and the photon energy ($E_{2000}$) of the emitted light from the second light source 2; therefore, the photon energy which is insufficiently supplied only with the light application from the first light source 1 may be augmented by the light application from the second light source 2. Meanwhile, a binder polymer molecule, one of the constituent of the photosensitive resin which is generally used, has a carbonyl group or a hydroxyl group in many cases. A harmonic absorption band, a double harmonic absorption band, and a triple harmonic absorption of these functional groups are located in the above-mentioned areas. Hence, there is a large possibility that the desirable results are obtained when the light source having a large spectral intensity distribution in the above-mentioned wavelength range (at least one of 500 to 850 nm, 1300 to 1700 nm, and 1900 to 2500 nm) is used even for any of the conventional photosensitive materials other than that for the photosensitive resin layer 10a used in this embodiment.

Incidentally, it needs no repetitive indication that in order to obtain the uniform exposure results within a surface of the board 10 having the photosensitive resin layer 10a formed thereon, it is important to arrange a second light guiding optical system (not shown) for guiding the radiant flux 65 from the second light source 2 so that the first light irradiation area obtained through the exposure and writing by the first light irradiation optical system 50 can be completely and uniformly irradiated.

The stage 11 used in this embodiment is scanned at least in two axial directions, and the scanning direction and scanning speed of the stage 11 are precisely controlled by a stage controller 13. In addition, the exposure apparatus has a function of adjusting a position in a z-axis direction so as to obtain a position where a focal point is formed by the imaging optical system 7. Moreover, such a mechanism for performing the modulation of the light modulation optical system 5 as part of the first light irradiation optical system 50, and the scanning for the stage 11 in cooperation with each other is provided (its details are as below). As a result, a desired pattern can be exposed on the photosensitive resin layer 10a.

In this embodiment, a radiant flux 55 emitted from the first light source 1 passes through a first light guiding optical system (52a, 52b and 52c) which is suitably provided, and a beam shaping optical element 8 for shaping an intensity distribution and a beam shape of a beam. The radiant flux 55 is then converted into a radiant flux having a desired pattern shape by a light modulation optical element 5 for modulating the shaped beam. After that, the resulting radiant flux passes through an imaging optical system 7 including a plurality of optical parts (7a, 7b, 7c and 7d) to image a desired pattern on the photosensitive resin layer 10a. The light modulation optical element 5 is digitally controlled by a light modulation control portion 9. Thus, the light modulation optical element 5 modulates the radiant flux made incident thereto so that the incident radiant flux is imaged in the form of a desired exposure pattern after passing through the imaging optical system 7. A conventional light modulation element can be used as the light modulation optical element 5. However, the light modulation optical element 5 suitable for this embodiment is, e.g., a two-dimensional light modulation element, which is a DMD by way of concrete example. In addition, when a microlens array is used as one of the optical parts constituting the imaging optical element 7, utilization efficiency of the light can be increased in some cases.

A light modulation operation of the light modulation optical element 5 is precisely controlled at a high speed by the light modulation control portion 9. A main control unit 30 of the exposure apparatus is provided in order to integrally control the light modulation control portion 9 and the stage controller 13.

The main control unit 30 is a unit for bearing a main control function of controlling the overall exposure apparatus. That is to say, the main control unit 30 receives predetermined pattern exposure data in accordance with an instruction issued from a production plan managing system 35, and controls the light modulation control portion 9 and the stage controller 13 based on the data thus received. The exposure apparatus has a communication section provided between the light modulation control portion 9 and the stage controller 13 as a sub-system. Thus, the exposure apparatus has a function of transmitting a control signal for a quantity of light and lighting to the first light source 1 and the second light source 2. When receiving the instruction issued from the production plan managing system 35, the main control unit 30 requests a memory 31 or a computer aided design (CAD) system 38 to transmit thereto the predetermined pattern exposure data or the various kinds of control programs. Incidentally, after being designed in the CAD system 38 in advance, the predetermined pattern exposure data is transmitted to the main control unit 30 through a network 39 and stored in the memory 31 in which the various kinds of control programs and arithmetic operation programs, the database and the like are stored. At that, in the first embodiment, the exposure apparatus includes a data inputting unit 33 for directly supplying data to the main control unit 30 of the exposure apparatus concerned, and a data displaying unit 32 for displaying thereon data. Thus, the pattern exposure data may be directly input through the data inputting unit 33. Alternatively, an instruction to start an operation for acquiring the pattern exposure data may be directly input by using the data inputting unit 33.

The network 39 may be a public communication line or a communication network via the same. Also, the CAD system 38 may be away from a place where the exposure apparatus according to the present invention is installed. A manufacture base is provided in the vicinity of a place where a product is used, i.e., the so-called consumption place, and the exposure apparatus according to the present invention is installed in the manufacture base, whereby it is possible to shorten a period of time required to convey a product between the-manufacture base and the consumption place. As a result, this contributes to the minimization of in-process inventories and distribution stocks, the reduction of selling opportunity loss, and the realization of the demand meeting production in addition to the reduction of the product conveyance cost. In such a business model, it is necessary to transmit pattern data containing design information from the CAD system 38 installed in a design base to the exposure apparatus installed in the manufacture base. Normally, however, since many pieces of information to be concealed such as know-how on the manufacture and business information are contained in such data, they are subjected to encipherment processing conforming to a specific procedure in advance so as not to be intercepted or so as not to be dishonestly altered in the middle of communication. At that, in order that a period of time required for the data to pass through the communication network to reduce the possibility of the interception and revision, the pattern data is desirably compressed prior to the encipherment to reduce the data capacity. Moreover, it is to be understood that in order to exclude the input mistake due to the human error, it is desirable to provide an information processor for automatically executing processing from the data compression to the data encipherment, and processing from the cipher decoding to the data restoration.

In addition, while not illustrated herein, the exposure apparatus desirably includes an arithmetic operation portion for executing the control program and the arithmetic operation program which are stored in the memory 31. Also, while omitted in FIG. 1, the exposure apparatus according to the present invention includes a measuring unit for measuring a position, a shape, and a size of a specific shape which is formed on the board 10 to be exposed or on its surface. Measurements acquired by the measuring unit are compared with predetermined numeric values which are transmitted from the CAD system 38 to be stored in the memory 31, and used in order to calculate correction values for fine adjustment of the motions of the light modulation optical system 5 and the stage 11.

In the present invention, in order to control the radiant fluxes so that the radiant flux 55 emitted from the first light source 1 and the radiant flux 65 emitted from the second light source 2 are substantially and simultaneously directed to the photosensitive resin layer 10a, the mechanism for controlling the radiant flux of at least one system is provided. Also, this mechanism is operated in cooperation with the modulation operation of the light modulation optical system 5 for modulating the radiant flux emitted from the first light source 1. A conventional radiant flux controlling mechanism can be used in the present invention. Concretely exemplifying radiant flux controlling units suitable for the present invention include a light shielding unit provided in the path of the i radiant flux, and a power source controller for supplying a power to the light source.

The light shielding unit provided in the path of the radiant flux is more concretely described hereafter. A shutter is provided in any place of the path (the light irradiation optical system including the light guiding optical system, the light modulation optical system and the imaging optical system) of the radiant flux. Alternatively, a shutter or a light shielding skirt is provided between the light irradiation optical system and the object 10 to be exposed. The light can be simply and conveniently shielded by these units.

When the mechanically operating shutter is provided in the path of the radiant flux, it is necessary to prevent the vibration due to the shutter operation from exerting a bad influence on optical parts such as a lens and a mirror which are located in the periphery of the shutter. For this reason, a vibration absorbing mechanism or a shock absorbing mechanism is desirably provided. It should be noted that an electro-optic (EO) modulator or an acoustic-optic (AO) modulator for which the vibration absorbing mechanism can be omitted can be applied when the radiant flux having a small diameter is shuttered.

A method of controlling the power to be supplied to the light source differs depending on the types of light sources. In the present invention, conventional power supply controllers corresponding to the respective types of light sources can be used. In the case of the light source in which some time lag is caused until a quantity of emitted light changes after the supplied power is changed, the conventional power supply controller is desirably used in combination with the above-mentioned light shielding means.

Since the most suitable first light source 1 in this embodiment is the laser diode array having a plurality of blue ultraviolet (violet) laser diodes arranged to each other, the most suitable radiant flux controlling unit corresponding to the laser diode array is a unit (not shown) which controls power to be supplied to the light source. Since the ON/OFF control for the laser diode is realized for a period of time of about 10 nanoseconds, a miniature and inexpensive controlling circuit is available.

On the other hand, in this embodiment, the metal halide lamp with a wavelength filter which is used as the second light source 2 takes a period of time of about 1 second until the stable lighting obtained after supply of the power. Thus, the most suitable radiant flux controlling unit in this embodiment is a light shielding skirt or a light shielding slit 3. While such radiant flux controlling unit may be provided in any place in the path of the radiant flux 65 emitted from the second light source 2. In this embodiment, such radiant flux controlling unit is provided between the object 10 to be exposed and the second light irradiation optical system 60. It should be noted that a conventional device for combination with any of the light sources other than the metal halide lamp, supply of the so-called standby power without full cut-off of the power to be supplied, or combination in use with a mechanical shutter or slit may be carried out.

Figure 6:
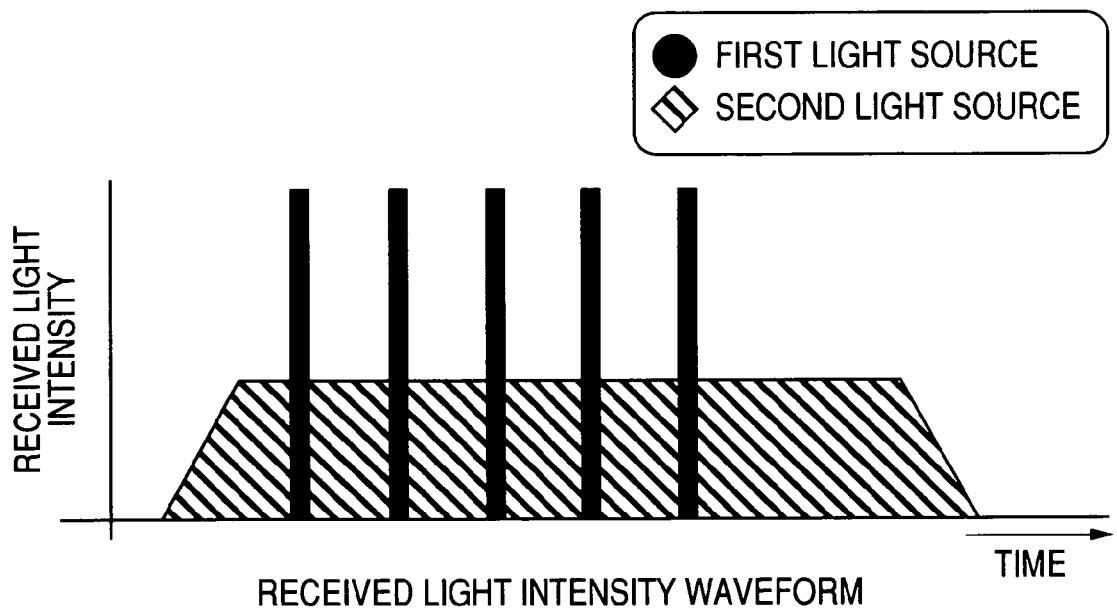
FIG. 6 is a conceptual diagram showing received light intensity of an object to be exposed by the exposure apparatus according to the present invention by way of example.
Figure 7:
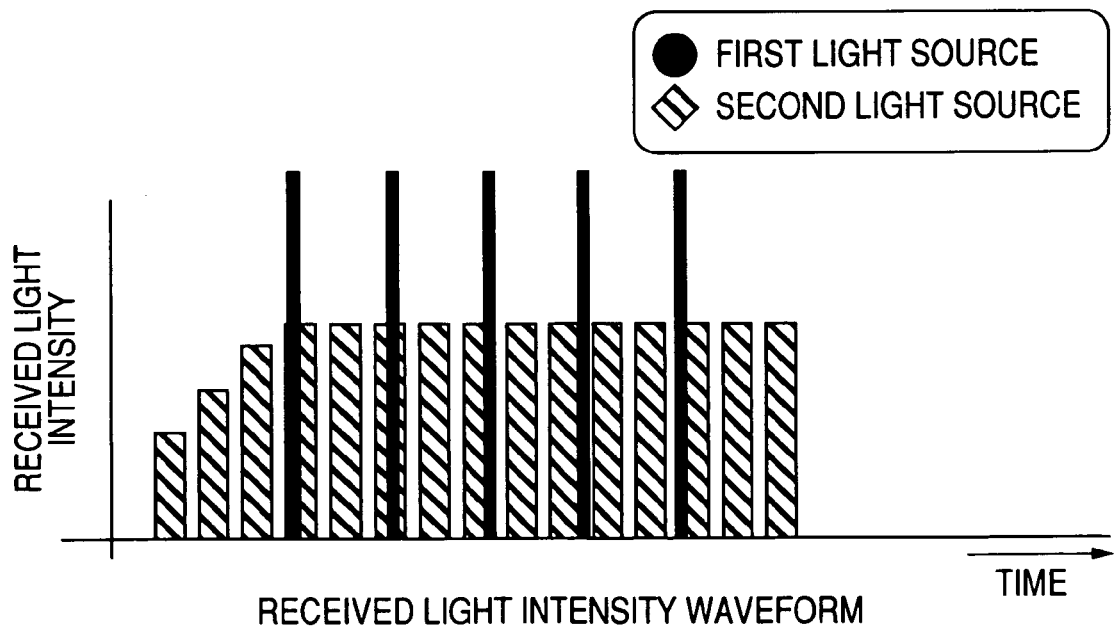
FIG. 7 is a conceptual diagram showing received light intensity of the object to be exposed by the exposure apparatus according to the present invention by way of another example.

In the present invention, instead of continuously lighting the first light source 1 and the second light source 2, the first light source 1 and the second light source 2 may be used in the so-called pseudo-continuous lighting state in which one or both of the light sources are turned ON/OFF at high speed. For example, a pulse lighting laser light source may be used as the first light source 1, and an inverter lighting fluorescent lamp may be used as the second light source 2 in some cases. In this exemplified case, the first light source 1 is pseudo-continuously lighted while the second light source 2 is continuously lighted; namely, the intensity of light received by the photosensitive resin layer 10a is illustrated for the above case. The light intensity follows a lapse of time as exemplified in FIG. 6. FIG. 7 is an example of the received light intensity obtained when both the first light source 1 and the second light source 2 are pseudo-continuously lighting sources. When the light sources as shown in these examples are used, strictly looking over with a time being finely partitioned, time zones are generated in each of which the light from the first light source 1 and the light from the second light source 2 are not simultaneously directed. However, in the present invention, this light irradiation is regarded as the substantially simultaneous light irradiation. This is because the optical reaction activating effect is obtained which is equivalent to that in the strictly simultaneous light irradiation in which both the first light source 1 and the second light source 2 are continuously lighted.

Figure 8A:
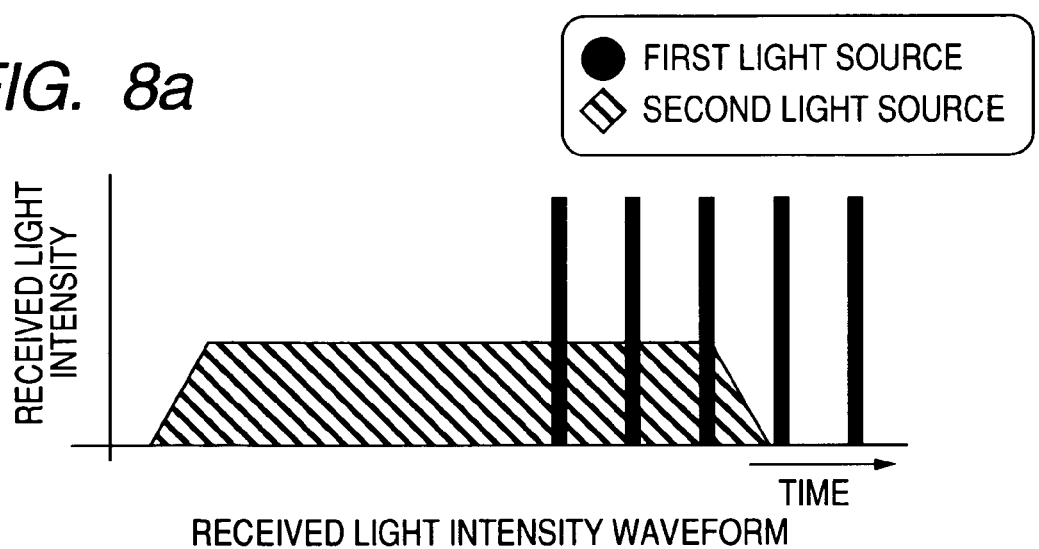
FIGS. 8a to 8c are conceptual diagrams showing still another example of the received light intensity of the object to be exposed by the exposure apparatus according to the present invention.
Figure 8B:
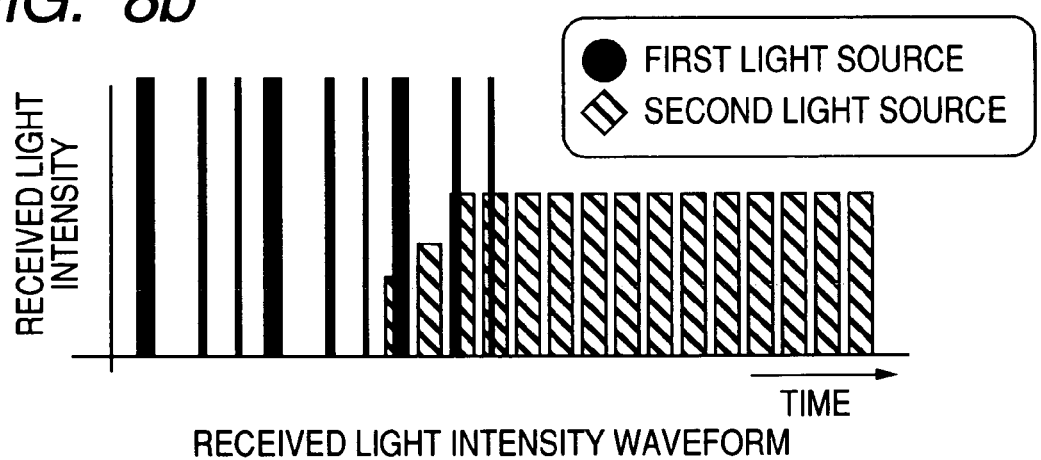
Figure 8C:
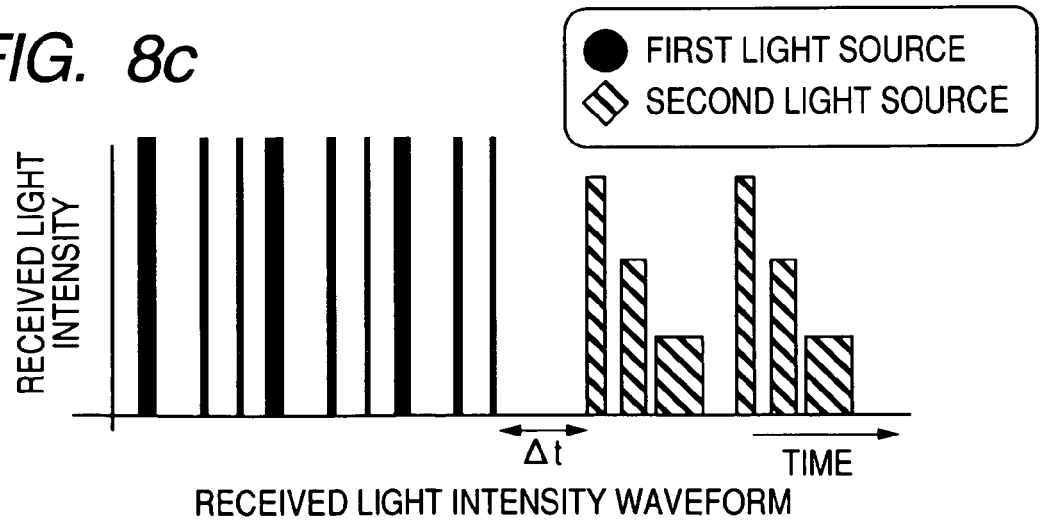

The range in which light irradiation is regarded as the substantially simultaneous light irradiation in the present invention corresponds to the case where there is a state in which at least parts of a time zone for which the light from the first light source 1 is directed to the board 10 to be exposed and a time zone for which the light from the second light source 2 is directed to the board 10 to be exposed overlap each other. For example, the case where the light from the second light source 2 is directed to the board 10 to be exposed prior to the light irradiation by the first light source 1 (refer to FIG. 8a), or the case where conversely, the light irradiation by the first light source 1 is made prior to the light irradiation by the second light source 2 (refer to FIG. 8b) is also an example of the substantially simultaneous light irradiation stated in the present invention. Even in the case where there is no time zone for which the simultaneous light irradiation is made (refer to FIG. 8c), this state is stated as the substantially simultaneous light irradiation in the present invention as long as a time interval (Δt) between the time zone for which the light from the first light source 1 is directed to the board 10 to be exposed and the time zone for which the light from the second light source 2 is directed to the board 10 to be exposed does not largely exceed 10 seconds.

Since in this embodiment, the laser diode array as the first light source 1 is turned ON/OFF at a high speed, while the metal halide lamp is continuously lighted, this state can be said as the substantially simultaneous light irradiation. Incidentally, when at least one of the first light source 1 and the second light source 2 is pseudo-continuously lighted, this state corresponds to the substantially simultaneous light irradiation. In addition, though there is no need for repetitive indication, the strictly simultaneous light irradiation may also be available.

Next, a description will be given of a method of exposing a photosensitive resin by using the above-mentioned exposure apparatus according to the present invention. As described above, the exposure apparatus according to the present invention can be applied to a method of exposing a conventionally known photosensitive resin. In this embodiment, however, a glass epoxy board on a surface layer of which a wiring was previously formed is used as the board 10 to be exposed. A photosensitive solder resist (PSR4000 made by TAIYO INK MFG. CO., LTD.) is formed (a film thickness is about 20 micrometers) on the uppermost layer of the glass epoxy board as the photosensitive resin layer 10*a*, and the photosensitive solder resist is exposed to form a resist pattern. At that, the photosensitive solder resist PSR4000 used in this embodiment is a negative type photosensitive resin which is used in many printed wiring board manufacturing factories, and its photosensitive dominant wavelength is 365 nm.

Figure 2:
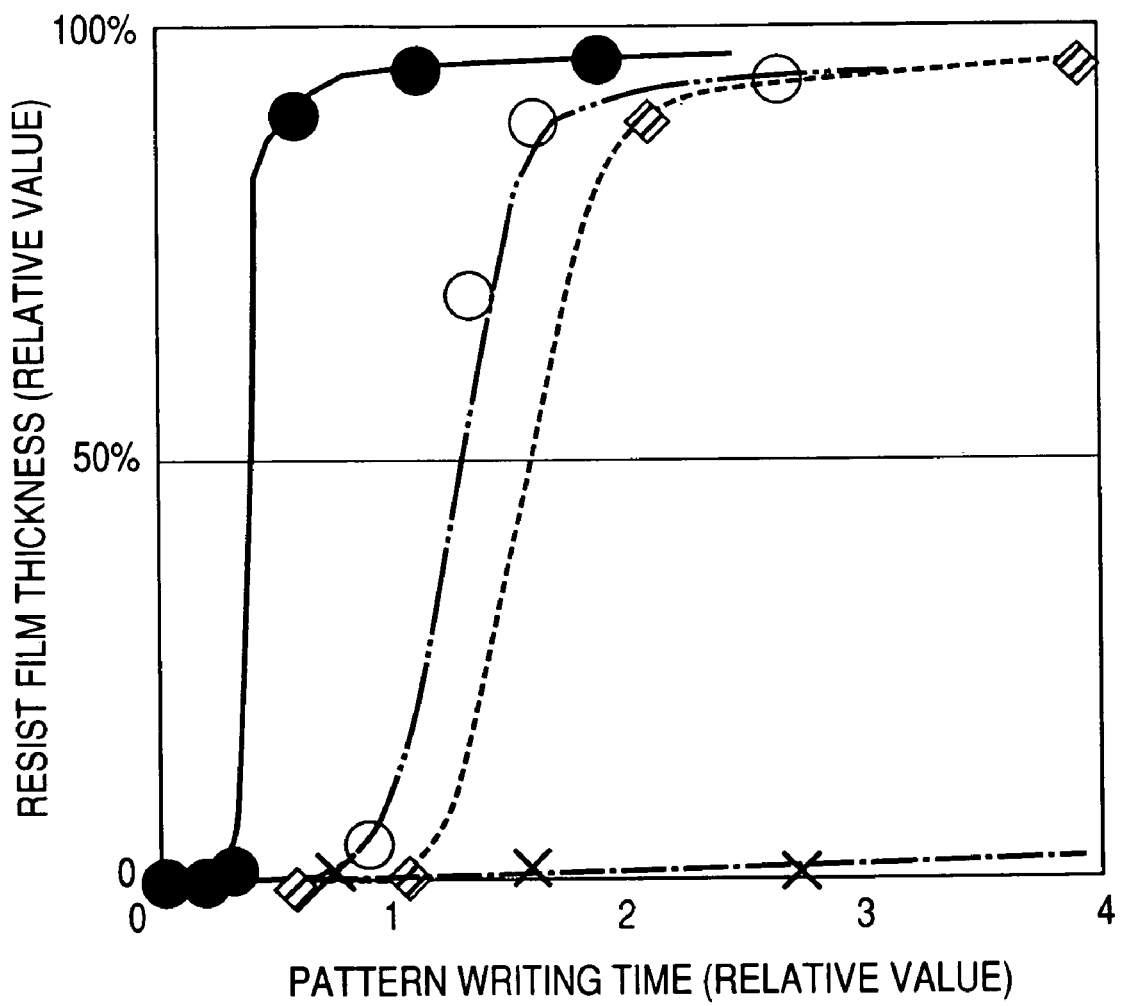
FIG. 2 is a graphical representation showing examples of pattern writing (pattern exposure) made by using the exposure apparatus according to the present invention.

The experiment results exemplified in FIG. 2 is a part of pattern drawing examples which are obtained by using the exposure apparatus according to the present invention. In this experiment, an opening pattern for a solder bump, having an opening diameter of 50 to 1000 micrometers was exposed by using the exposure apparatus according to the present invention, and developed under predetermined conditions. A shape of the resulting resist was measured. In FIG. 2, the abscissa represents time required to write (expose) the pattern, and the ordinate represents resist thickness. A graph of FIG. 2 shows a situation in which as the exposure increases, the curing reaction of the resist proceeds and the film thickness increases. At that, in this experiment, the time required to write (expose) the pattern is set so as to be generally proportional to the exposure dose.

The graph of FIG. 2 also shows that when the light from the first light source 1 and the light from the second light source 2 are simultaneously directed to the photosensitive resin to expose the same, thereby forming the pattern, the pattern writing time is shortened to about 30% of that when the light irradiation for formation of the pattern is made by using only the first light source 1. As a result, it is obvious that the light irradiation from the second light source 2 activated the exposure reaction of the resist. On the other hand, when, after completion of the exposure by the first light source 1, the photosensitive resin is left as it is for 1 hour or more, and the light application from the second light source 2 is made, the writing time is merely slightly shortened as compared with the case where only the first light source is used. In addition, when only the light irradiation from the second light source 2 is made, the curing reaction of the resist does not proceed at all.

The board 10 to be exposed which was obtained through the processes as described above was subjected to predetermined after-processing, more specifically, after-heating processing for the resist, and surface processing for the solder bump pads. Thereafter, solder paste was printed and filled in the opening portion of the solder resist, and then solder-reflow was performed, whereby the desired printed wiring board can be manufactured. A failure such as the lifted or the peeled-off due to the insufficient curing of the solder resist was not observed at all in the printed wiring board concerned.

Incidentally, it needs no repetitive indication that the operation for shortening the pattern writing time which is obtained by using the exposure apparatus according to the present invention is influenced by the various factors to be changed. The writing time shortening rate may be changed within the range of 10 to 90% depending on the kinds and thicknesses of the used photosensitive resin layer 10*a*, the methods of emitting the light from the first light source 1, and the kinds of second light source 2, and the like. Hence, it is important to confirm the exposure conditions prior to the practical application. In addition, even when the film thicknesses and materials are each the same, the exposure conditions applied to the conventional mask aligner, and the exposure conditions applied to the exposure apparatus according to the present invention may be different from each other in many respects. Thus, it is convenient that in order to avoid the confusion in the work during the board mass production, a database like an exposure condition conversion table is produced for the automatic reference. It is to be understood that the exposure condition may be arranged in the form of a database, and the database may be held in the memory 31.

Figure 3:
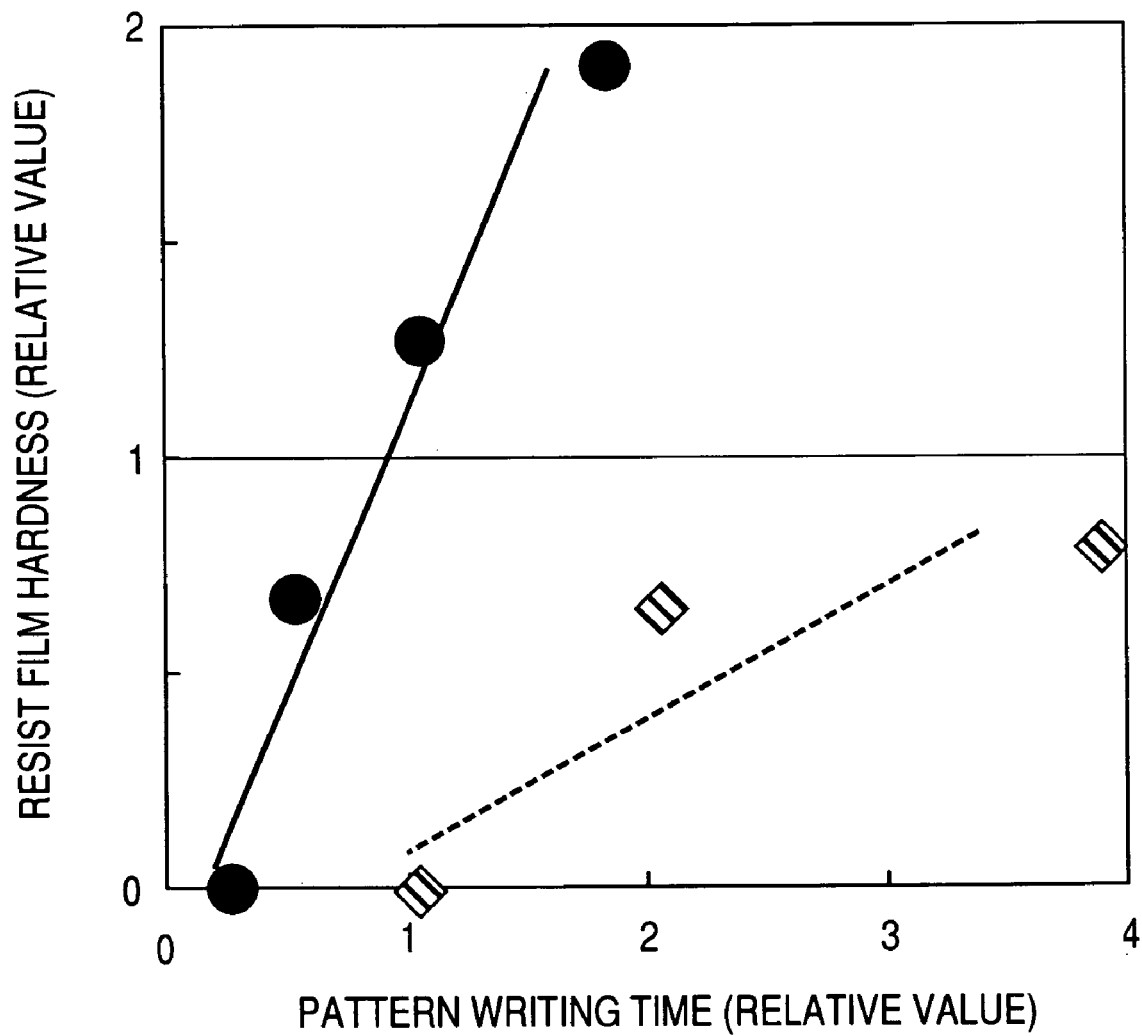
FIG. 3 is a graphical representation showing the other examples of the pattern writing (the pattern exposure) made by using the exposure apparatus according to the present invention.
Figure 4:
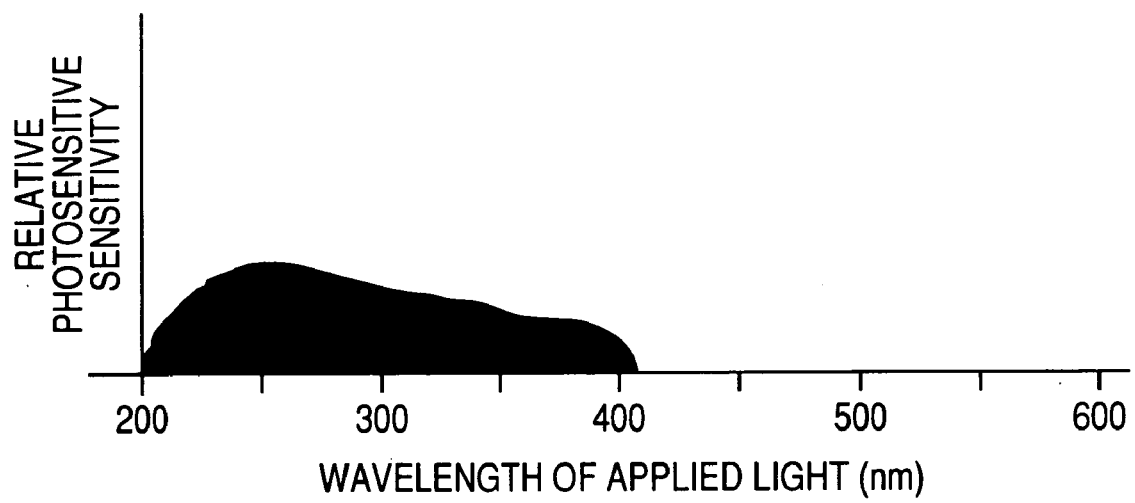
FIG. 4 is a graphical representation showing an example of typical photosensitive sensitivity characteristics of a photosensitive resin.

The experiment results exemplified in FIG. 3 are another part of the results of exposing (writing) the pattern by using the exposure apparatus according to the present invention. While in this experiment, the pattern was exposed by using the exposure apparatus according to the present invention similarly to the above-mentioned experiment and developed under the predetermined conditions, the hardness of the resulting resist was measured instead of measuring the film thickness thereof. In FIG. 3, the abscissa represents time required to write the pattern and the ordinate represents the hardness of the resist. A graph of FIG. 3 shows that the time required to write the pattern is generally proportional to the exposure dose.

Also, the graph of FIG. 3 shows that when the pattern is formed by using the first light source 1 together with the second light source 2, the hardness of the resist abruptly increases as compared with that in the case of the light irradiation for exposure of the pattern using only the first light source 1. The acceleration rate of the hardness of the resist by the former is about 2 times faster than that by the latter.

Next, similarly to the above-mentioned experiment, the photosensitive solder resist (PSR4000 made by TAIYO INK MFG. CO., LTD.) was applied in the form of the photosensitive resin 10*a* on the uppermost layer of the glass epoxy board used as the board 10 to be exposed on which the wiring may be previously formed. Then, the exposure was performed by using the so-called mask aligner for performing the exposure through a photo mask. After that, a difference of this experiment results from the above-mentioned experiment results was examined.

The photosensitive solder resist PSR4000 is the negative type photosensitive resist which is used in many printed wiring board manufacturing factories, and thus the pattern formation by the mask aligner can be performed without any special problems. However, when the light emitted from the metal halide lamp was applied during the irradiation of the ultraviolet radiation through the mask, there arose such a problem that the relative position shift of the pattern was remarkably increased. This problem probably results from the fact that the board 10 to be exposed and the photo mask absorbed the infrared radiation component contained in the light emitted from the metal halide lamp to gradually and thermally expand. That is to say, in the case of the board on which the wiring is previously formed, the positions which are different in coefficient of thermal expansion from one another are generated within the board surface due to the density in distribution of the wiring. As a result, the ununiform expansion is caused. It is also given as the cause that the object 10 to be exposed and the photo mask are different in coefficient of thermal expansion from each other. The distortion and deformation of the printed wiring board due to the ununiform expansion were caused during the exposure process and an amount of deformation changed hour by hour. Hence, even when the pattern formed on the mask was previously corrected, it was impossible to perfectly cope with such a situation. Moreover, there also arose such a problem that the aligner was influenced by the exhaust heat from the metal halide lamp provided inside the aligner to be heated so that the distortion was caused in the lens and the mirror. The distortion of the optical system could not be controlled. The experiment results clearly show that the mask exposing method and the exposure reaction acceleration by the second light source cannot be simply combined with each other.

Figure 9:
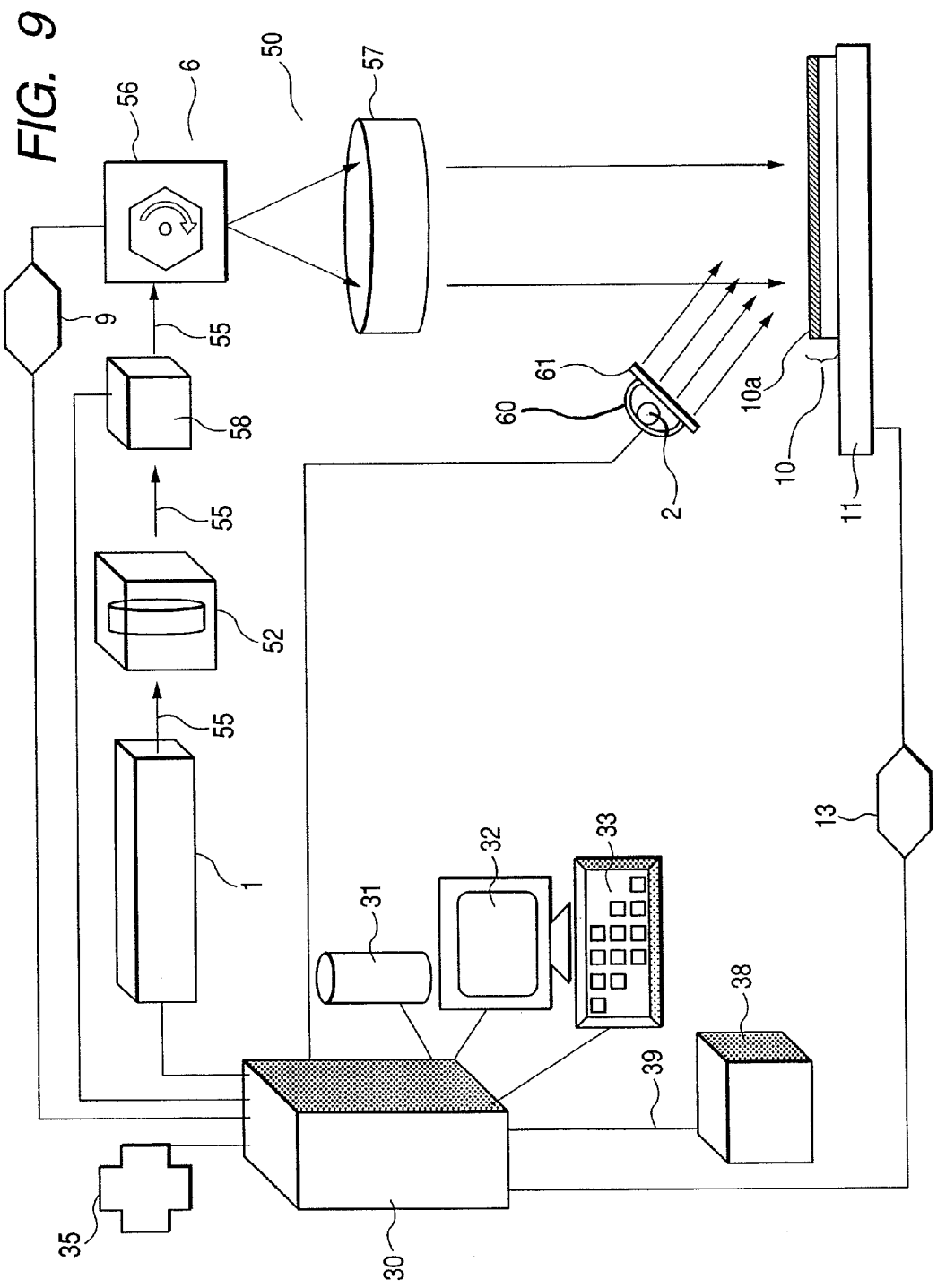
FIG. 9 is a schematic constructional diagram showing a second embodiment of the exposure apparatus according to the present invention.

FIG. 9 is a schematic constructional diagram showing a second embodiment of the mask-less exposure apparatus according to the present invention. The mask-less exposure apparatus of this embodiment includes a stage 11, a first light source 1, a first light irradiation optical system 50, a second light source 2, and a second light irradiation optical system 60. The stage 11 moves with a board 10 to be exposed placed thereon. The board 10 has a photosensitive resin layer 10a with sensitivity to ultraviolet radiation formed thereon. The first light source 1 emits light containing a wavelength component, of the ultraviolet radiation, in the wavelength range of 350 to 390 nm. The first light irradiation system 50 images a pattern on the photosensitive resin layer 10a on the board 10 to be exposed which is placed on the stage 11 to expose and write the pattern while beam-scanning a radiant flux 55 emitted from the first light source 1 based on data on a desired exposure pattern. The second light source 2 emits light containing at least part of a wavelength component, of the visible to infrared radiation, in the wavelength range of 450 to 25,000 nm. Also, the second light irradiation optical system 60 guides a radiant flux 65 emitted from the second light source 2 so as to thoroughly apply light to a first light irradiation area which is obtained through the exposure and writing by the first light irradiation optical system 50.

The exposure apparatus of this embodiment is different from that of the first embodiment shown in FIG. 1 in (1) the wavelength of the light emitted from the first light source 1, (2) the method of exposing the pattern, and (3) the wavelength of the light emitted from the second light source 2. Taking into consideration that the photosensitive resin which is generally used for the manufacture of the printed wiring board normally has the photosensitive dominant wavelength of 365 nm (i line), in this embodiment, a light source for emitting light fulfilling the photosensitive property of the generally used photosensitive resin is used as the first light source 1. In the first embodiment shown in FIG. 1, the DMD is used as the optical modulation system in order to modulate the radiant flux emitted from the first light source 1. However, the DMD which can be available inexpensively and on a massive scale at the present point cannot be said to be sufficient in terms of an ultraviolet radiation durability. Then, in this embodiment, a beam scanning optical system 6 including a polygon mirror 56 is used instead of performing the modulation with the DMD. Consequently, the first light irradiation optical system 50 in this embodiment is constructed by combining the first light guiding optical system 52, an acousto-optic element 58, the polygon mirror 56, and an f-θ lens 57. It is to be understood that any of conventional beam scanning optical systems other than the polygon mirror, e.g., a galvano-mirror may be used. However, the polygon mirror is the most suitable for the optical system which can inexpensively realize the high-speed beam scanning. If the DMD having the high ultraviolet radiation durability, or a two-dimensional light modulation element other than the DMD, e.g., a grating light valve (GLV) or a spatial light modulator (SLM) becomes available inexpensively and on a massive scale, these spatial modulation elements may be used.

In this embodiment, the beam scanning optical system 6 is controlled with speed and precision by the modulation control portion 9. Thus, a mechanism for performing the scanning of the beam scanning optical system 6 as part of the first light irradiation optical system 50 and the scanning of the stage 1 in cooperation with each other is provided so that a desired pattern can be exposed on the photosensitive resin layer 10a.

In addition, the wavelength of the light emitted from the first light source 1 is shifted to the shorter wavelengths as compared with the case of the first embodiment shown in FIG. 1. As a result, the energy of the incident photon increases, and thus the photon energy resulting from the light emitted from the second light source 2 is enough even in less quantity. Consequently, the light emitted from the second light source 2 may have the wavelength component having the longer wavelengths than those in the first embodiment shown in FIG. 1. It needs no repetitive indication that this embodiment may use the same second light source 2 as that of the first embodiment shown in FIG. 1.

Specific examples of the first light source 1 in this embodiment include a solid-state excitation laser light source (YAG-3H) and an extra-high pressure mercury lamp. However, an ultraviolet diode light source (an LED or an LD) is the most suitable for the first light source 1 from a viewpoint of miniaturization and energy saving. At the present point, it is difficult to obtain the high-output ultraviolet radiation from the ultraviolet diode. Hence, in this embodiment, the practical exposure throughput is ensured based on the synergistic effect with the auxiliary light irradiation from the second light source 2.

The second light source 2 used in this embodiment is a conventional light source for emitting light containing a wavelength component, of the infrared radiation, in the wavelength range of 2500 to 25,000 nm. More specifically, a large number of infrared semiconductor laser light sources may be arranged. Alternatively, a halogen lamp, a xenon lamp, a metal halide lamp or the like may also be used. In addition, when the beam scanning is performed at a high speed by using the laser light source, such a device as to use a light shielding skirt can be omitted.

The constructions other than those described above, more specifically, the constructions of the board 10 to be exposed, the photosensitive resin layer 10a, the stage 11, the stage controller 13, the main controlling portion 30, the memory 31, the data displaying unit 32, the data inputting unit 33, the production plan managing system 35, the CAD system 38, the network 39 and the like are the same as those of the first embodiment exemplified in FIG. 1.

FIG. 10 is a schematic constructional diagram showing a third embodiment of a mask-less exposure apparatus according to the present invention. The mask-less exposure apparatus of this embodiment includes a stage 11, a first light source 1, a second light source 2, an optical mixing system 4, and an optical mixing light irradiation optical system 16. The stage 11 moves with a board 10 to be exposed placed thereon. The board 10 has a photosensitive resin layer 10a with sensitivity to ultraviolet radiation formed thereon. The first light source 1 emits light containing a wavelength component, of the violet radiation, in the wavelength range of 400 to 410 nm. The second light source 2 emits light containing at least a part of a wavelength component, from the visible light to the infrared radiation, in the wavelength range of 450 to 2500 nm. The optical mixing system 4 optically mixes a radiant flux 55 emitted from the first light source 1 and a radiant flux 65 emitted from the second light source 2. Also, the optical mixing light irradiation optical system 16 modulates a mixed radiant flux 15 obtained through the optical mixing by the optical mixing system 4 based on data on a desired exposure pattern, and then images a pattern on the photosensitive resin layer 10a on the board 10 to be exposed which is placed on the stage 11 to expose and write the pattern. Incidentally, the optical mixing light irradiation optical system 16 includes an optical mixing light guiding optical system 17, an optical mixing light modulation optical system 18, and an optical mixing imaging optical system 19.

In this embodiment, a conventional two-dimensional light modulation element or the like can be used as the optical mixing light modulation optical system 18. More specifically, the optical mixing light modulation optical system 18 is a light modulation element such as the DMD. No ultraviolet component having a wavelength shorter than 400 nm is contained in the optically mixed light made incident to the optical mixing light modulation optical system 18. Hence, the DMD is the most suitable for the optical mixing light modulation optical system 18 in view of the fact that it requires no ultraviolet radiation durability, and is inexpensive and available on a massive scale.

In this embodiment, since the radiant fluxes of the two systems which are largely different in wavelength distribution from each other are imaged after optical mixing, chromatic aberration is generated during the imaging of the optically mixed light. Of the components of the optically mixed radiant flux 15, the radiant flux 55 from the first light source 1 and the radiant flux 65 from the second light source 2 are different in focusing position from each other. In this embodiment, the positional alignment and height alignment of the stage 11 are carried out with a focal point position of the radiant flux 55, from the first light source 1, as the shorter wavelength component as reference. That is to say, since the radiant flux 55 from the first light source 1 activates the photosensitive molecules of the photosensitive resin layer 10a, the photosensitive reaction proceeds in the position where the radiant flux 55 from the first light source 1 is imaged, and the pattern corresponding to the imaging shape is obtained. On the other hand, the radiant flux 65 from the second light source 2 contains no photon component for electron-exciting the photosensitive resin layer 10a. Hence, the imaging position and imaging shape of the radiant flux 65 for the second light source 2 have no direct relation to the proceeding of the photosensitive reaction (but, have an indirect relation thereto). In other words, there is no problem as long as the imaging position and imaging shape of the radiant flux 65 from the second light source 2 are obtained in the vicinity of the imaging position of the radiant flux 55 from the first light source 1.

In this embodiment, as described above, after the radiant flux 55 emitted from the first light source 1 and the radiant flux 65 emitted from the second light source 2 are optically mixed, the resulting optically mixed radiant flux is imaged. Hence, the light components from the light sources of the two systems can be necessarily and nearly simultaneously applied to nearly the same place.

It should be noted that the exposure apparatus can be applied to the present invention without any problems as long as it has the construction similar to that exemplified in FIGS. 1, 9 and 10. For example, an exposure apparatus (not shown) is expected which includes a stage 11, a first light source 1, a first light modulation optical system, a second light source 2, a second modulation optical system, a light modulation optical mixing system, and a light modulation optical mixing imaging optical system. The stage 11 moves with a board 10 to be exposed placed thereon. The board 10 has a photosensitive resin layer 10a with sensitivity to ultraviolet radiation formed thereon. The first light source 1 emits light containing a wavelength component, of the violet radiation, in the wavelength range of 400 to 410 nm. The first light modulation optical system modulates a radiant flux 55 from the first light source 1. The second light source 2 emits light containing at least part of a wavelength component, from the visible to infrared radiation, in the wavelength range of 450 to 2500 nm. The second light modulation optical system modulates a radiant flux 65 from the second light source 2. The light modulation optical mixing system optically mixes first modulated light obtained through the modulation by the first modulation optical system and second modulated light obtained through the modulation by the second modulation optical system. Also, the light modulation optical mixing imaging optical system images a modulated and optically mixed radiant flux obtained through the optical mixing by the light modulation optical mixing system in the form of a pattern on the photosensitive resin layer 10a on the board 10 to be exposed which is placed on the stage 11. The feature of this exposure apparatus is that the radiant fluxes from the light sources of the two systems are respectively modulated and then optically mixed. Thus, this exposure apparatus needs to include the light modulation systems of the two systems. However, it is possible to select the light modulation system fulfilling the characteristics of the light source. Thus, from this viewpoint, this exposure apparatus is advantageous.

It should be noted that it is not special problem to use, for the present invention, an exposure apparatus that employs a proper combination of the constructions exemplified herein without being against the objects of the present invention, or an exposure apparatus that employs the constructions exemplified herein together with the conventional one(s).

According to the embodiments as described above, it is possible to increase the throughput of the exposure process for exposing the photosensitive resin by using the mask-less direct exposure apparatus. In addition, it is possible to increase the throughput of the processes for manufacturing the printed wiring board by performing the expose by using the mask-less direct exposure apparatus of the present invention.

What is claimed is:

1. An exposing method for directly exposing an exposure pattern on a photosensitive resin layer having sensitivity to an ultraviolet radiation formed on a substrate, comprising:

modulating a radiant flux emitted from a first light source for emitting light consisting of a wavelength component in the wavelength range of 400 to 410 nm using a digital micro mirror device based on data of a desired exposure pattern;

irradiating a resulting modulated radiant flux on said photosensitive resin layer so as to enable exposure of said photosensitive resin layer and to create said desired exposure pattern; and irradiating a second radiant flux emitted from a second light source for emitting light containing a wavelength component in the wavelength range of 450 to 2,500 nm on said photosensitive resin layer substantially simultaneously with said irradiating of said resulting modulated radiant flux on said photosensitive resin layer so as to enable exposure of said photosensitive resin layer and augment a photosensitive reaction in said photosensitive resin layer.

2. The exposing method according to claim 1, wherein said photosensitive resin layer is made of any one of a plating resist, an etching resist, and a solder resist.

3. The exposing method according to claim 1, wherein said photosensitive resin layer is made of any one of a modified acrylate system monomer and a modified methacrylate system monomer.

4. The exposing method according to claim 1, wherein said second radiant flux does not incorporate said desired exposure pattern.

5. The exposing method according to claim 1, wherein the wavelength range of 400 to 410 nm enables extended durability of the digital micro mirror device.

* * * * *